United States Patent [19]

Einthoven

[11] Patent Number: 4,638,551

[45] Date of Patent: Jan. 27, 1987

[54] SCHOTTKY BARRIER DEVICE AND METHOD OF MANUFACTURE

[75] Inventor: Willem G. Einthoven, Belle Mead, N.J.

[73] Assignee: General Instrument Corporation, New York, N.Y.

[21] Appl. No.: 703,703

[22] Filed: Feb. 21, 1985

Related U.S. Application Data

[63] Continuation of Ser. No. 422,386, Sep. 24, 1982, abandoned.

[51] Int. Cl.$^4$ ............................................. H01L 29/48
[52] U.S. Cl. .................................... 29/571; 29/576 B; 29/578; 29/591; 357/4; 357/15; 148/1.5; 148/DIG. 139; 148/DIG. 140; 148/DIG. 42; 427/84
[58] Field of Search ...................... 29/571, 578, 576 B, 29/589, 590, 591; 148/1.5, DIG. 139, DIG. 140, DIG. 42; 357/4, 15; 427/84, 88

[56] References Cited

U.S. PATENT DOCUMENTS

| | | | |
|---|---|---|---|
| 3,513,366 | 5/1970 | Clark ..................... | 148/DIG. 139 X |
| 3,769,109 | 10/1973 | MacRae et al. ......... | 148/DIG. 42 X |
| 3,891,479 | 6/1975 | Zwernemann ....... | 148/DIG. 139 X |
| 4,206,540 | 6/1980 | Gould ..................... | 148/DIG. 139 X |
| 4,223,327 | 9/1980 | Nara et al. ............. | 148/DIG. 139 X |
| 4,310,362 | 1/1982 | Roche et al. ......... | 148/DIG. 139 X |
| 4,377,030 | 3/1983 | Pettenpaul et al. ... | 357/15 X |
| 4,505,023 | 3/1985 | Tseng et al. ......... | 29/576 B X |

*Primary Examiner*—Brian E. Hearn
*Assistant Examiner*—David A. Hey
*Attorney, Agent, or Firm*—Roland Plottel

[57] ABSTRACT

An improved Schottky barrier device and method of manufacture is disclosed. The device has a semiconductor layer of first conductivity type; an insulating layer covering one face of the semiconductor layer, and has an opening therein. A conductor layer covers the semiconductor layer where the semiconductor layer is exposed by the opening and there forms a recitifying junction with the semiconductor layer. A first region of opposite conductivity type is at the one face of semiconductor layer and extends from where the conductor layer meets the insulating layer and below the conductor layer. A second region of opposite conductivity type is at the one face of semiconductor layer and begins where the conductor layer meets the insulating layer and extending below the insulating layer.

12 Claims, 4 Drawing Figures

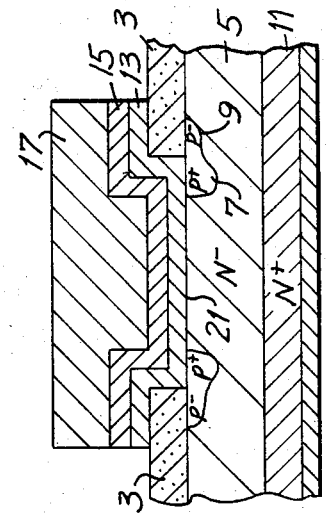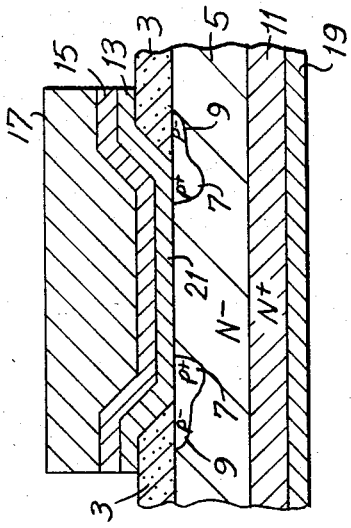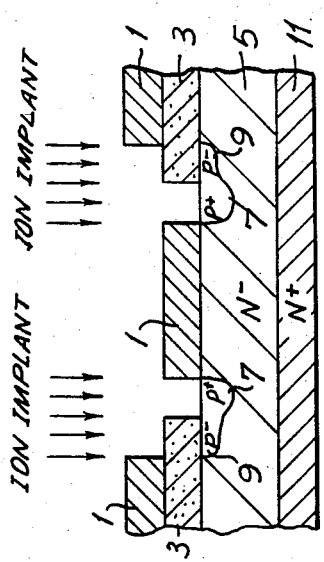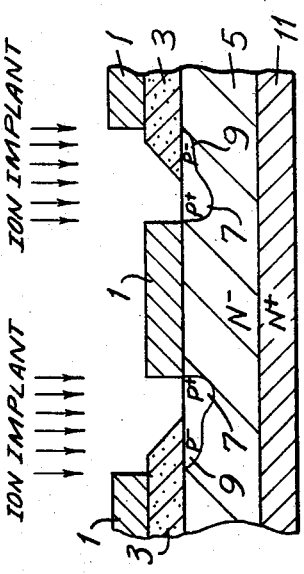

SCHOTTKY BARRIER DEVICE AND METHOD OF MANUFACTURE

This application is a continuation of U.S. application Ser. No. 422,386, filed Sept. 24, 1982, now abandoned.

FIELD OF INVENTION

Schottky barrier devices comprise a conductor-semiconductor interface which acts as a rectifying junction. Theoretically, these devices have numerous applications because of their high-speed operation. However, in their simplest form, Schottky barrier devices exhibit a high reverse bias leakage current, and the reverse bias breakdown voltage is poorly defined and less than one-half the theoretical value. These deficiencies in operating characteristics are caused primarily by current flowing across the edge portion of the barrier when the device is reverse biased. To reduce this edge current flow, the regions in the semiconductor material underlying the edge of the Schottky barrier are doped with an impurity that provides a conductivity opposite to that of the remainder of this material. These oppositely doped regions are known as guard rings. Even with guard rings, however, the performance of Schottky barrier devices is significantly below theroretical values.

SUMMARY OF THE INVENTION

The present invention is an improved Schottky barrier device and a method of manufacturing such a device. The improvement lies in the insertion of a second guard ring in the semiconductor material adjacent the outer surface of the first ring and doped with the same type impurity as the first ring but at a substantially different concentration. This second ring widens the depletion region surrounding the first ring which causes a lowering of the electric field strength in this region. As a result, the breakdown voltage for the Schottky barrier device is increased without loss in speed or current handling capacity. The second ring lies generally below the insulating layer that is adjacent the conductor layer of the Schottky barrier. After the insulating layer is deposited but prior to laying the conductor layer of the Schottky barrier, both the first and second rings are inserted economically in one manufacturing step using the ion-implantation method. By properly adjusting the energy level and concentration of the ion implant, the concentration of impurities passing through the insulating layer and forming the second ring is significantly lower than the concentration of impurities passing directly into the semiconductor material and forming the first ring. The breakdown voltage at the interface between the rings and the oppositely-doped surrounding semiconductor material is higher than the breakdown voltage of the conductor-semiconductor interface forming the Schottky barrier. As a result, breakdown of the device occurs first along the Schottky barrier. In a second embodiment, after the ion-implantation step, the rings are deepened by diffusion causing the breakdown voltage along the ring-surrounding semiconductor interface to fall below the breakdown voltage of the Schottky barrier. As a result, in this second embodiment, breakdown of the device occurs first at the ring-surrounding semiconductor junction. In a third embodiment, the insulating layer is beveled along the edge contacting the conductor. This geometry results in a second ring of gradually decreasing impurity concentration in the direction away from the conductor layer because of the decreasing number of ions able to penetrate the insulating layer to form the second ring. As a result, the electric field in the depletion region surrounding the rings and along the schottky barrier is more evenly distributed, and the breakdown voltage for the device is increased.

BRIEF DESCRIPTION OF THE DRAWINGS

FIGS. 1 and 3 are cross-sectional views of semiconductor wafers showing the step in the manufacture of a Schottky barrier device of forming a double guard ring by the ion-implantation method.

FIGS. 2 and 4 are cross-sectional views of Schottky barrier diodes formed by removing the photoresistant layer and adding conductor layers to the wafers of FIGS. 1 and 3, respectively.

The Figures are representational only and are not drawn to scale. The same reference characters are applied to similar elements throughout the drawings.

DESCRIPTION OF THE PREFERRED EMBODIMENT

FIG. 1 shows a semiconductor wafer such as silicon with substrate 11 heavily doped with impurities such as phosphorus to form an N-type of conductivity and epitaxial layer 5 more lightly doped with N-type impurities. While N-type impurities are used in the substrate and epitaxial layer of the present embodiment, it is possible also to use P-type impurities. The thickness and impurity concentration of epitaxial layer 5 depends on the particular breakdown voltage desired for the Schottky barrier device. Breakdown voltage increases with increasing thickness and decreasing impurity concentration of the epitaxial layer. For a device using the present invention, a breakdown voltage of 50 V was achieved with epitaxial layer 5 having a thickness of 5 microns and an impurity concentration of $7 \times 10^{15}$ atoms/cm$^3$, and a breakdown voltage of 120 V was achieved with an epitaxial layer having a thickness of 8 microns and an impurity concentration of $2 \times 10^{15}$ atoms/cm$^3$. An insulating layer 3 such as silicon oxide is formed on the epitaxial layer and an opening or window, typically 1 to 50 mils in diameter, is etched in the insulating layer by conventional photoetching techniques. The insulating layer thickness ranges between 2000 Å and 3000 Å. A layer of photoresistant material 1 such as KPR manufactured by Eastman Kodak is deposited on the silicon oxide layer and on the exposed portion of the epitaxial layer, and using conventional methods, an annular opening is formed in the photoresistant layer surrounding the periphery of the insulating layer, such that adjacent annular areas of the insulating and epitaxial layers are exposed. Using the ion implantation method, two adjacent guard rings 7 and 9 are formed in the epitaxial layer by perpendicularly directing at the annular opening in the photoresistant layer activated ions of a type producing a conductivity opposite to that of the epitaxial layer. These ions enter the epitaxial layer where it is exposed and, to a lesser extent, the epitaxial layer where it is covered only by the insulating layer. These ions are unable to penetrate the photoresistant layer. In this embodiment, activated ions such as boron are used to produce a P-type conductivity in the guard rings.

After formation of the guard rings, Schottky barrier 21 is formed by removing photoresistant layer 1 and depositing conductor layer 13 which may be a metal or metal-like material such as nickel chromium or tungsten in a laYer between 500 Å and 2000 Å thick. The conductor layer 13 covers the surface of epitaxial layer 5 where it is exposed by the circular opening in insulating layer 3. In this embodiment, the conductor layer also covers a portion of the surface of the insulating layer adjacent this opening. In this example, conductor layer 13 extends about 1 mil beyond the circumference that is directly above the outermost circumference of the guard rings. A Schottky barrier diode is constructed by additionally depositing contact metals 15 and 17 which may be a layer of platinum between 500 Å and 2000 Å thick and a layer of silver between 1 micron and 5 microns thick, respectively. These metals act as one terminal for the diode. A layer of contact metal 19 deposited on substrate layer 11 serves as the opposite terminal.

By adjusting the energy of the ion implant to a relatively low level, about 70 keV, only a small percentage of the ions striking insulating layer 3 are able to penetrate this layer to form guard ring 9. However, even at this relatively low energy level, virtually all the ions striking the epitaxial layer directly are able to penetrate into this layer to form guard ring 7. Therefore, the method of this invention enables the formation of two adjacent guard rings of substantially different net impurity concentrations in one manufacturing step.

With the thickness of insulating layer 3 known, the energy and impurity concentration or dose of the ion implant is selected to produce a net concentration of impurity atoms in ring 9 of between $4 \times 10^{11}$ atoms/cm$^2$ and $1.2 \times 10^{12}$ atoms/cm$^2$ and in ring 7 of between $5 \times 10^{12}$ atoms/cm$^2$ and $1 \times 10^{15}$ atoms/cm$^2$. If conductor layer 13 extends beyond the outermost circumference of the guard rings, then the net impurity concentration of ring 9 should be at the higher end of its range. If the conductor layer stops before this circumference, then the net impuritY concentration for ring 9 should be at the lower end of its range. The depth or thickness for ring 9 should be approximately 2000 Å and for ring 7 between 0.5 microns and 1 micron. The width of ring 7 in this example is approximately twice the thickness of epitaxial layer 5. The width of ring 9 should approximately equal the thickness of the epitaxial layer if conductor layer 13 extends beyond the outermost circumference of the guard rings, and, if the conductor layer does not extend beyond this circumference, the width of ring 9 should be approximately twice the thickness of the epitaxial layer.

Lightly doped guard ring 9 adjacent to heavily doped guard ring 7 produces a wider depletion region having a lower and more evenly distributed electric field than that surrounding only one heavily doped ring. The result is a higher overall breakdown voltage for the Schottky barrier device. This improvement is effected without increasing the thickness of the epitaxial layer and without a loss in the device's speed or current handling capacity. Moreover, since ring 7 is heavily doped and lightly doped ring 9 lies below insulating layer 3, there is no practical production of a parasitic Schottky transistor.

In the embodiment illustrated in FIGS. 3 and 4, the impurity concentration of guard ring 9 gradually decreases in the direction away from the conductor layer. This gradient in the concentration of ring 9 is produced by beveling the peripheral edge of insulating layer 3 prior to implanting the rings. The gradient removes electric field irregularities in the region between the two rings and further improves the breakdown characteristics of the Schottky device. The bevel on the insulating layer is formed using the known photoetching technique of depositing a layer of silane over the insulating layer prior to etching the opening or window in this layer. This bevel has a slope of between 0.25 and 0.4. It would be preferable to have a slope of about 0.1; however, this present technique imposes a limit of about 0.25 on this slope. The specifications and manufacturing method for the embodiment of FIGS. 3 and 4 are in all other respects the same as for the embodiment of FIGS. 1 and 2.

In another embodiment (not shown), after the ion-implantation step, the rings are deepened and, to a lesser extent, widened by diffusion to cause the breakdown voltage along the ring-surrounding semiconductor interface to fall below the breakdown voltage of the Schottky barrier. Diffusion is effected at about 1000° C. for approximately eight hours and results approximately in a doubling in the depth of the two rings and an increase in width for each ring equal to about two-thirds its increase in depth. The initial impurity concentration of each ring is increased somewhat to compensate for this diffusion.

Of course, it should be understood that although the specific embodiments described involve a circular semiconductor wafer, circular layers of other materials and annular or circular openings in these layers, this invention is not limited to any particular geometric shape or form.

I claim:
1. A method of manufacturing a Schottky barrier device comprising:
    (a) providing a semiconductor layer of a first conductivity type;
    (b) forming an insulating layer over one face of the semiconductor layer;
    (c) forming an opening in the insulating layer;
    (d) depositing a photoresistant layer over the insulating layer and over the semiconductor layer where it is exposed by the opening in the insulating layer;
    (e) forming an opening in the photoresistant layer surrounding the periphery of the opening in the insulating layer such that adjacent areas of the insulating and semiconductor layers are exposed;
    (f) directing activated ions of the type producing a conductivity opposite to that of the semiconductor layer at the opening in the photoresistant layer for introduction into the semiconductor layer below said opening, the energy of the ions being such that the insulating layer acts as a partial shield to the ions.
    (g) removing the photoresistant layer;
    (h) depositing a conductor layer over the semiconductor layer where it is exposed by the opening in the insulating layer.

2. The method of claim 1 wherein the insulating layer is silicon oxide having a thickness of between 2000 Å and 3000 Å.

3. The method of claim 1 further comprising forming a bevel on the periphery of the opening in the insulating layer.

4. The method of claim 1 wherein the activated ions have an energy and concentration such that the proportion of ions entering the semiconductor layer ot those striking this layer directly is substantially higher than the proportion of ions entering the semiconductor layer through the insulating layer first.

5. The method of claim 1 wherein the activated ions have an energy of approximately 70 keV.

6. The method of claim 1 further comprising depositing the conductor layer over an adjacent area of the insulating layer.

7. The method of claim 1 further comprising placing the semiconductor layer in an environment of elevated temperature for a period of time to cause diffusion of the ions.

8. The method of claim 1 further comprising depositing a layer of contact metal over the conductor layer and a layer of contact metal over the opposite face of the semiconductor layer.

9. A method according to claim 22, further comprising forming a bevel in said insulating layer in the region of said opening, at least prior to said directing step, with said bevel sloping downward towards said opening.

10. A method according to claim 9 wherein said bevel is formed with a slope of between 0.1 and 0.4.

11. A method of manufacturing a Shottky barrier device comprising:
 (a) providing a semiconductor layer of a first conductivity type;
 (b) forming an insulating layer over one fact of the semiconductor layer with an opening therein, and with said insulating layer made thinner surrounding said opening;
 (c) depositing a mark with an open region exposing said thinner insulating layer and an immediately adjacent region of said opening but not a central portion of said opening;
 (d) introducing ions of the type producing a conductivity opposite to that of the semiconductor layer into the semiconductor layer below the opening exposed by the mask and below the thinner insulating layer, the energy of the ions being such that the thinner insulating layer acts only as a partial shield to the ions, and a concentration of ions in a semiconductor layer below the exposed opening is higher than a concentration of ions below said thinner insulating layer;
 (e) removing at least that portion of the mark over the central portion of the opening; and
 (f) depositing a conductor layer over the semiconductor layer in the region of the opening.

12. A method according to claim 11 wherein said thinner insulating layer is beveled and slopes down towards the opening in the insulating layer, and said conductor layer extends over the edge of said thinner insulating layer at said opening and above said bevel.

* * * * *